US007692251B2

(12) United States Patent
Chung et al.

(10) Patent No.: US 7,692,251 B2
(45) Date of Patent: Apr. 6, 2010

(54) TRANSISTOR FOR SEMICONDUCTOR DEVICE AND METHOD OF FORMING THE SAME

(75) Inventors: Sung Woong Chung, Gyeonggi-do (KR); Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 526 days.

(21) Appl. No.: 11/284,957

(22) Filed: Nov. 23, 2005

(65) Prior Publication Data

US 2007/0020902 A1    Jan. 25, 2007

(30) Foreign Application Priority Data

Jul. 21, 2005  (KR)  .................. 10-2005-0066270

(51) Int. Cl.
*H01L 29/76* (2006.01)
*H01L 29/94* (2006.01)
*H01L 31/00* (2006.01)

(52) U.S. Cl. ............... 257/379; 257/330; 257/380; 257/510; 257/903; 257/E21.429; 438/282

(58) Field of Classification Search .............. 438/427, 438/430, 282, 270, 197; 257/330
See application file for complete search history.

(56) References Cited

U.S. PATENT DOCUMENTS

| 5,702,969 A * | 12/1997 | Lee ........................ 438/239 |
| 7,157,770 B2 * | 1/2007 | Park et al. .................. 257/330 |
| 7,479,421 B2 * | 1/2009 | Kavalieros et al. .......... 438/197 |
| 2003/0011961 A1 * | 1/2003 | Basceri et al. ............... 361/312 |
| 2005/0042833 A1 * | 2/2005 | Park et al. .................. 438/282 |
| 2005/0139900 A1 * | 6/2005 | Jung et al. .................. 257/319 |
| 2009/0090976 A1 * | 4/2009 | Kavalieros et al. .......... 257/369 |

* cited by examiner

*Primary Examiner*—Zandra Smith
*Assistant Examiner*—Telly D Green
(74) *Attorney, Agent, or Firm*—Townsend and Townsend and Crew LLP

(57) ABSTRACT

Disclosed herein is a transistor for a semiconductor device and a method of forming the same. According to the present invention, a novel transistor structure combining a plane channel transistor and a fin-type channel transistor formed on the semiconductor substrate is provided to secure a sufficient channel width as compared to that of the plane channel transistor, thereby satisfying drive current regulated for the transistor.

18 Claims, 5 Drawing Sheets

TRANSISTOR FOR SEMICONDUCTOR DEVICE AND METHOD OF FORMING THE SAME

BACKGROUND OF THE INVENTION

1. Field of the Invention

The present invention relates to a memory device. In particular, the present invention provides a transistor for a semiconductor device and a method of forming the same, and more specifically to a transistor for a semiconductor device and a method of forming the same wherein a sufficient channel area of a transistor for a semiconductor device is secured in spite of reduction of design rules according to a high integration of a semiconductor device, thereby securing drive current for the transistor.

2. Discussion of the Related Art

Recently, there has been a trend in designing lower power transistors for a semiconductor device securing operation current even though design rules of the semiconductor device are reduced. Channel area is one considerable factor for determining drive current in a cell transistor for a semiconductor device.

In a conventional plane channel transistor, it is difficult for a transistor having a channel dimension of 1000 nm or less to secure On/Off characteristics of the transistor. Typically, a fin-FET transistor protruding out of a channel region is employed as a cell transistor having design rules of 50 nm or less, thereby securing sufficient drive current of the transistor.

FIG. 1 is a simplified layout view illustrating an active region 1, a device isolation region 3, and a gate region 5 in accordance with a conventional transistor for a semiconductor device. FIGS. 2 through 5 are simplified cross-sectional views illustrating a method of forming a transistor for a semiconductor device in accordance with the conventional transistor. FIGS. 2 and 4 are cross-sectional views taken along the line I-I', FIG. 3 is a cross-sectional view taken along the line II-II' in FIG. 1, and FIG. 5 is an enlarged view of III in FIG. 4.

Referring to FIGS. 2 and 3, a pad insulating film pattern (not shown) defining a device isolation region 3 shown in FIG. 3 is formed on a semiconductor substrate 10. The semiconductor substrate 10 is etched using the pad insulating film pattern as an etching mask by such a predetermined thickness so as to form a trench 13 for device isolation. Thereafter, an oxide film 15 and a nitride film 17 having a predetermined thickness are successively formed on the surface of the trench 13, and then a device isolation film 20 filling the trench 13 is formed. Next, the device isolation film 20, the nitride film 17 and the oxide film 15 in the gate region 5 shown in FIG. 1 are etched using a recess gate region mask (not shown) as an etching mask by such a predetermined thickness so as to form a recess gate region 25 exposing a sidewall of a fin-type active region 1, wherein the recess gate region mask is overlapped with the gate region 1. After that, the remaining pad insulating film pattern is removed to expose the active region 1.

Referring to FIG. 4, a channel ion implantation process is performed on the exposed active region 1. Next, a gate oxide film 30 is formed on the entire surface of the exposed active region 1, and then a gate structure 40 filling the recess gate region 25 is formed in the gate region 5 shown in FIG. 1.

Referring to FIG. 5, a channel region of the fin-type gate structure 40 is formed on a sidewall and an upper portion of the protruded fin-type active region, so that the channel length of the fin-type structure 40 is increased as compared to that of the plane channel transistor. Since a depletion layer region 45 of a cell transistor is limited to the width of the active region, the fin-type gate structure has lowered threshold voltage thereof.

In fabricating a transistor for a semiconductor device in design rules of 50 nm or less, a phenomenon occurs in which a width of a depletion layer region in a channel region becomes larger than a half width of a fin-type channel region. Due to this phenomenon, it is essential to decrease the threshold voltage of the transistor. Accordingly, in order to satisfy the regulated threshold voltage of the transistor, the transistor must have a highly concentrated ion implantation channel region. However, the highly concentrated ion implantation channel region causes an increase in junction leakage current, thereby degenerating refresh characteristics of DRAM.

SUMMARY OF THE INVENTION

According to the present invention, techniques for forming a memory device are provided. In particular, the present invention provides a transistor for a semiconductor device and a method of forming the same. More specifically, the present invention provides a transistor for a semiconductor device and a method of forming the same wherein a novel transistor structure combining a plane channel transistor and a fin-type channel transistor formed on the semiconductor substrate is provided to secure a sufficient channel width as compared to that of the plane channel transistor, thereby satisfying regulated drive current. Although the present invention has been applied to a specific memory device, there can be other applications.

In order to achieve the above advantage, in an embodiment of the present invention, a transistor for a semiconductor device includes a semiconductor substrate having a device isolation film defining an active region, a gate region disposed on the device isolation film, the gate region passing across the active region, a recess gate region formed in the gate region, the recess gate region exposing only one sidewall of the active region, a gate isolation film disposed on the surface of the active region and the sidewall of the active region exposed by the recess gate region, and a gate structure disposed on the gate insulating film and the device isolation film.

Preferably, the recess gate regions are alternately disposed on the neighboring device isolation film so that the recess gate regions can not overlap each other in their longitude direction. The line width of the gate structure is substantially equal to that of the recess gate region, preferably. In addition, the line width of the gate structure on the recess gate region can be greater than that of the gate structure on the device isolation film, and the ratio of the line width of the gate structure on the recess gate region to that on the device isolation film ranges from 1:1.1 to 1:1.8.

In another embodiment of the present invention, a method of forming a transistor for a semiconductor device includes (a) forming a device isolation film defining an active region in a semiconductor substrate, (b) defining a gate region formed on the device isolation film passing across the active region, (c) recessing a predetermined portion in the gate region to form a recess gate region exposing only one sidewall of the neighboring active region, (d) forming a gate insulating film the surface of the active region exposed by the recess gate region, and (e) forming a gate structure on the gate insulating film and the device isolation film of the gate region.

Preferably, a thickness of the device isolation film ranges from 150 to 1000 nm. Preferably, the recess gate regions are also alternately formed on the neighboring device isolation film so that the recess gate regions can not overlap with each other in their longitude direction. Preferably, the line width of the gate structure is substantially equal to that of the recess gate region. In addition, the line width of the gate structure on the recess gate region is preferably greater than that of the gate structure on the device isolation film, and the ratio of the line width of the gate structure on the recess gate region to that on the device isolation film preferably ranges from 1:1.1 to 1:1.8. The predetermined thickness in the step (c) ranges from 50 to 500 nm. Preferably, the recessing process in the step (c) is performed using a mixture gas of (i) at least one of a fluorine-base gas and a chlorine-base gas and (ii) $O_2$ gas in the ratio ranging from 1~10:1, wherein the fluorine-base gas is selected from the group consisting of $CF_4$, $CHF_3$, $C_3F_8$, $NF_3$ and combinations thereof, and the chlorine-base gas is selected from the group consisting of $Cl_2$, $Cl_4$ and a combination thereof. The gate insulating film forming process can be performed by one of a dry oxidation method using an oxygen gas at a temperature ranging from 500 to 1100□C, a wet oxidation method using a mixture gas of $O_2/H_2$, or a plasma oxidation method using a gas selected from the group consisting of $O_2$, $N_2$, He, $H_2$, $N_2O$ and combination thereof. Also, the gate insulating film is selected from the group consisting of silicon oxide film, hafnium oxide film, aluminum oxide film, zirconium oxide film, silicon nitride film and combinations thereof, and a thickness of the gate insulating film ranges from 1 to 10 nm. Besides, the gate structure comprises a polysilicon layer formed by a polysilicon CVD method accompanied with a doping process including P or B. In accordance with the method of forming a transistor for a semiconductor device, a step of cleaning the exposed surface of the active region by using a solution including HF can be further included after the step (c).

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1:
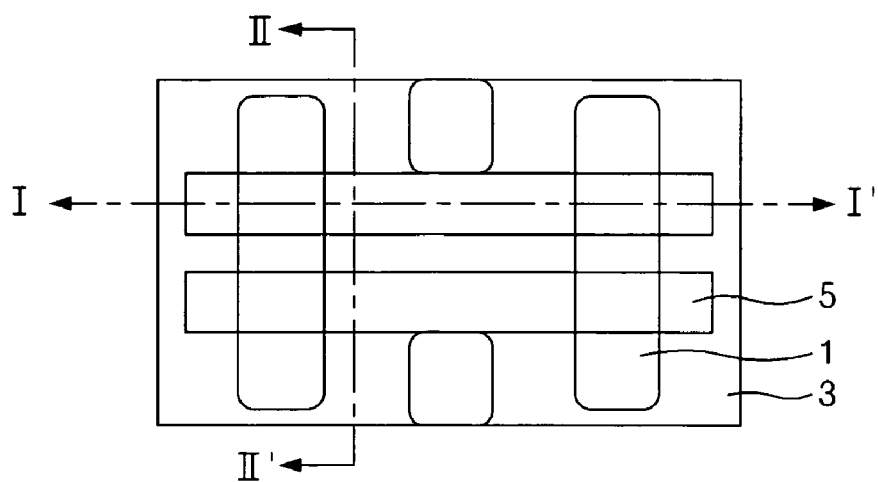
FIG. 1 is a simplified layout view illustrating a conventional transistor for a semiconductor device.
Figure 2:
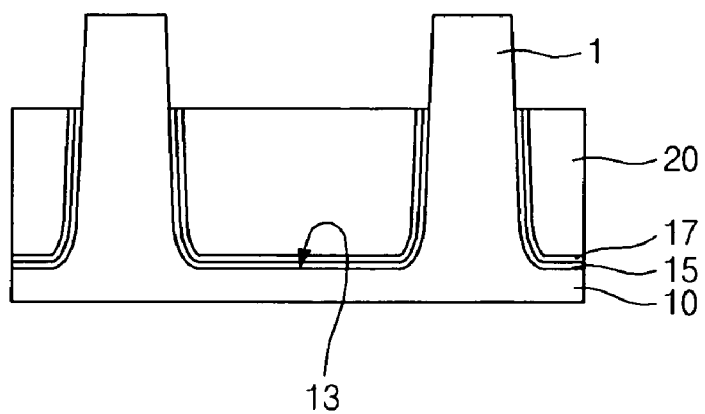
FIGS. 2 through 5 are simplified cross-sectional views illustrating a conventional method of forming a transistor for a semiconductor device.
Figure 3:
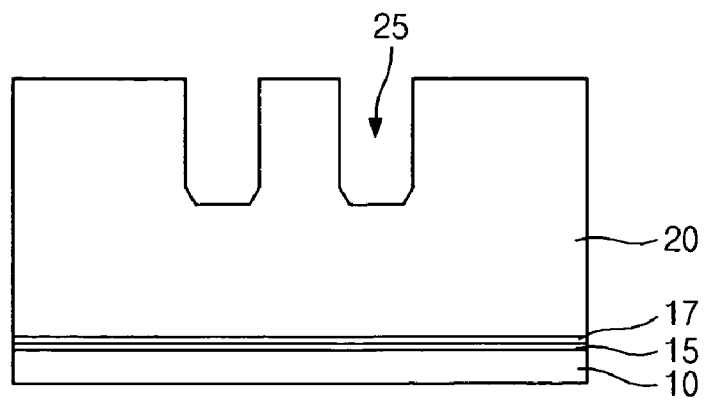
Figure 4:
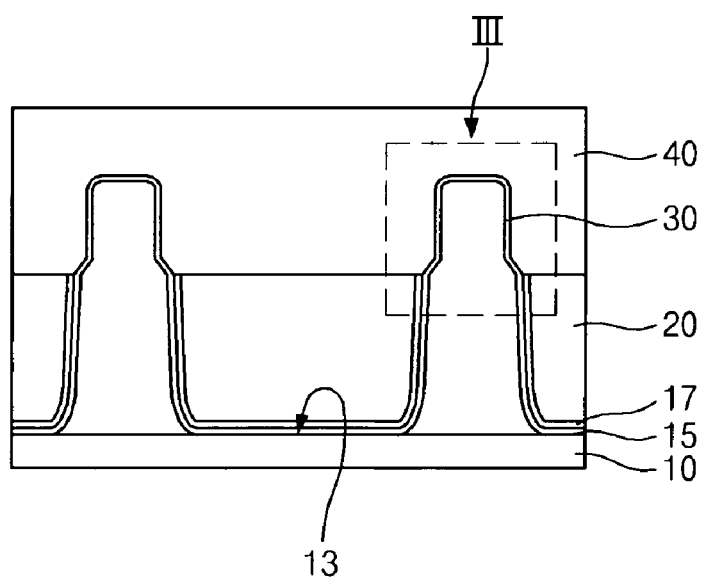
Figure 5:
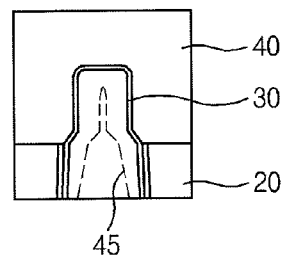
Figure 6:
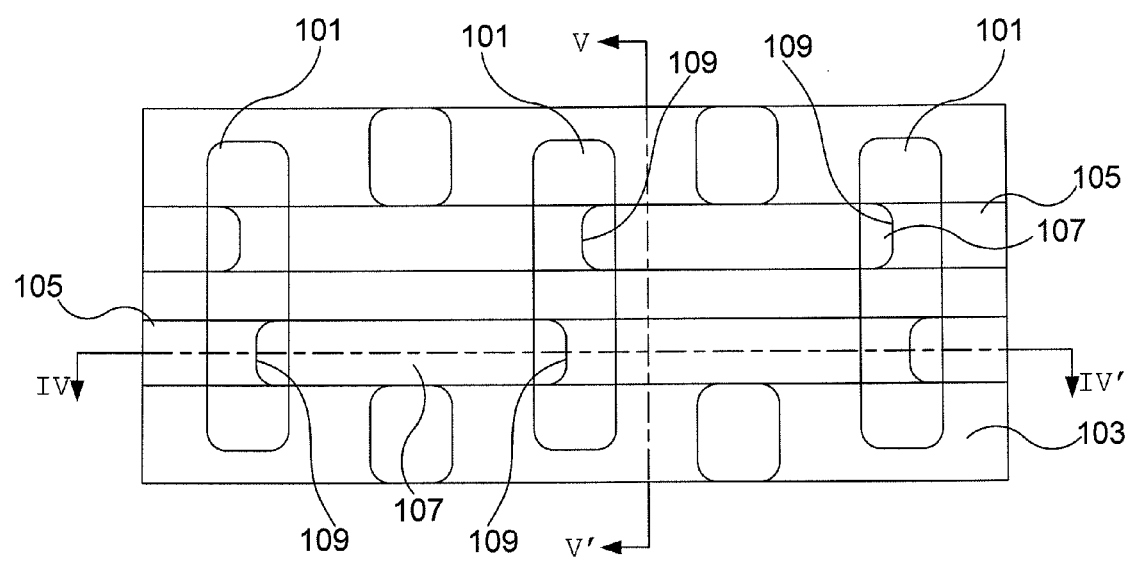
FIG. 6 is a simplified layout view illustrating a transistor for a semiconductor device in accordance with an embodiment of the present invention.

FIG. 6 is a simplified layout view illustrating a transistor for a semiconductor device having three parallel active regions 101, device isolation regions 103, two parallel gate regions 105, and a recess gate region 107 formed in the gate region 105 between each pair of adjacent active regions 101 in accordance with an embodiment of the present invention. Each recess gate region 107 is formed by etching the device isolation region by such a predetermined thickness so as to expose a sidewall 109 of each active region 101 where the active region 101 is overlapped with the gate region 105. The recess gate regions 107 are alternately disposed on the neighboring device isolation regions 103 SO that the recess gate regions 107 do not overlap with each other along a longitudinal direction of the active regions 101. Preferably, the line width of each gate region 105 is substantially equal to that of each recess gate region 107. In addition, the line width of the portion of the gate region 105 that is overlapped with the recess gate region 107 can be larger than that of the other portion of the gate region 105. The ratio of the line width of the portion of the gate region 105 that is overlapped with the recess gate region 107 to that of the other portion preferably ranges from 1:1.1 to 1:1.8.

Figure 7:
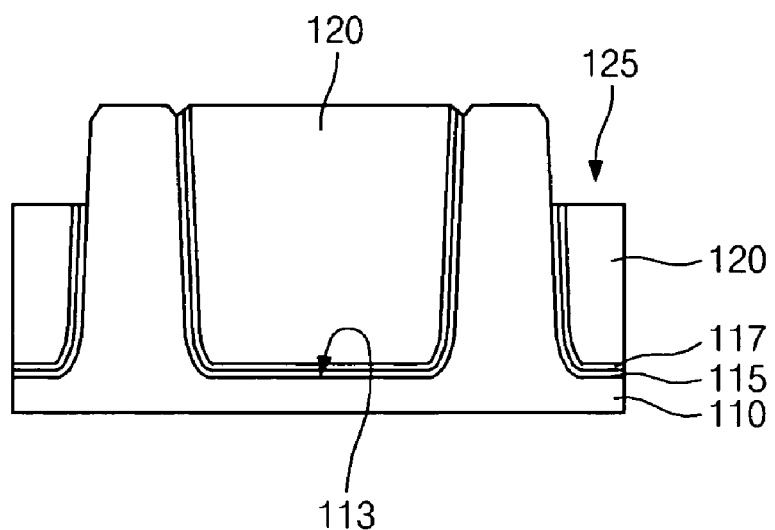
FIGS. 7 through 10 are simplified cross-sectional views illustrating a method of forming a transistor for a semiconductor device in accordance with an embodiment of the present invention.
Figure 8:
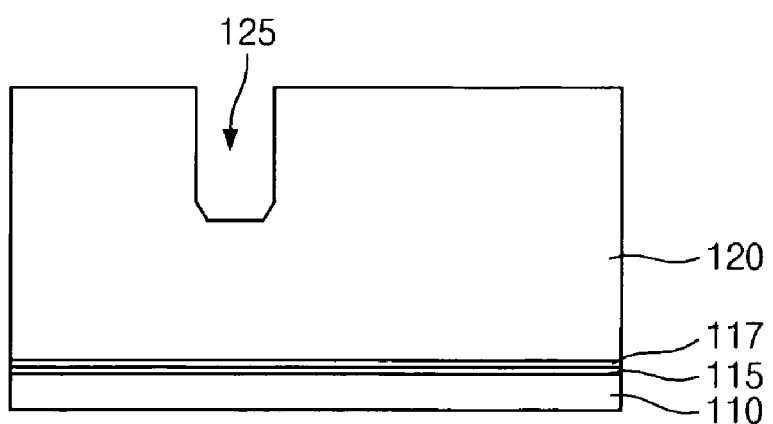
Figure 9:
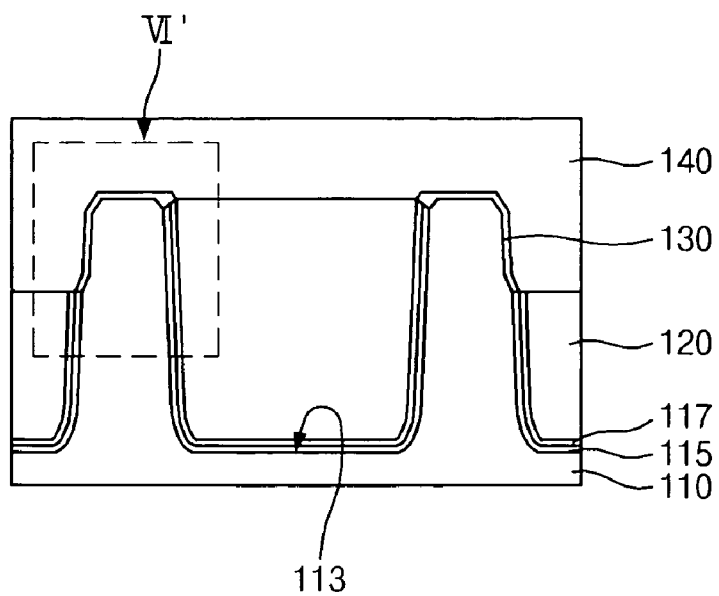

FIGS. 7 through 10 are simplified cross-sectional views illustrating a method of forming a transistor for a semiconductor device in accordance with an embodiment of the present invention. FIGS. 7 and 9 are simplified cross-sectional views taken along the line IV-IV' in FIG. 6, and FIG. 8 is a simplified cross-sectional view taken along the line V-V' in FIG. 6.

Referring to FIGS. 7 and 8, a pad insulating film pattern (not shown) defining a device isolation region 103 shown in FIG. 6 is formed on a semiconductor substrate 110. Next, the semiconductor substrate 110 is etched using the pad insulating film pattern as an etching mask by such a predetermined thickness so as to form a trench 113 for device isolation defining an active region 101 shown in FIG. 6. Preferably, a depth of the trench 113 ranges from 150 to 1000 nm.

Thereafter, an oxide film 115 and a nitride film 117 having a predetermined thickness are successively formed on the surface of the trench 113, and then a device isolation film 120 is formed filling up the trench 113.

After that, the device isolation film 120 is polished until the pad insulating film pattern is exposed. The device isolation film 120, the nitride film 117, and the oxide film 115 are etched using a mask defining the recess gate region 107 shown in FIG. 6 as an etching mask by such a predetermined thickness so as to form a recessed space 125 exposing only one sidewall of the active region 101 overlapped with the gate region 105. Here, the recessed spaces 125 are alternately formed on the neighboring device isolation region 103 so that the recess gate regions can not overlap with each other in their longitude direction, and the depth of the recessed space 125 preferably ranges from 50 to 500 nm. In addition, the etching process for forming the recessed space 125 is preferably performed using a mixture gas of (i) at least one of a fluorine-base gas and a chlorine-base gas and (ii) $O_2$ gas in the ratio ranging from 1~10:1, wherein the fluorine-base gas includes $CF_4/CHF_3/C_3F8/NF_3$ and the chlorine-base gas includes $Cl_2/Cl_4$.

Thereafter, the remaining pad insulating film pattern is removed to expose the active region 101. On the other hand, the pad insulating film pattern can be removed prior to the etching process for forming the recessed space 125.

Referring to FIG. 9, the gate insulating film 130 is formed on the exposed surface of the active region after the exposed surface of the active region 105 is subjected to a cleaning process using a solution including HF. At this time, the gate insulating film 130 forming process is preferably performed by one of a dry oxidation method using $O_2$ gas at a temperature ranging from 500 to 1100° C., a wet oxidation method using a mixture gas of $O_2/H_2$, or a plasma oxidation method using a gas selected from the group consisting of $O_2$, $N_2$, He, $H_2$, $N_2O$ or combinations thereof. In addition, the gate insulating film 130 is preferably selected from the group consisting of silicon oxide film, hafnium oxide film, aluminum oxide film, zirconium oxide film, silicon nitride film and combinations thereof. A thickness of the gate insulating film 130 preferably ranges from 1 to 10 nm. On the other hand, a channel ion implantation process can be performed on the exposed active region 101 to form a channel region (not shown) prior to the gate insulating film 130 forming process.

Next, a gate conductive layer (not shown) is deposited on the entire surface to fill up at least the recessed space 125 including the gate insulating film 130, and then a planarized hard mask layer is formed on the gate conductive layer. Preferably, the gate conductive layer comprises a polysilicon layer. At this time, the gate conductive layer can be formed depositing a polysilicon on the entire surface accompanied with a doping process including P or B, or depositing a polysilicon doped with P or B.

Thereafter, a stacked structure of the hard mask layer and the gate conductive layer is patterned using a mask for defining the gate region 105 shown in FIG. 6 so as to form a gate structure 140.

In a subsequent process, both active regions adjacent to a sidewall of the gate structure 140 are subjected to an ion implanting process so as to form a source/drain region. Next, conventional subsequent processes are performed to complete the formation of the transistor.

Figure 10:
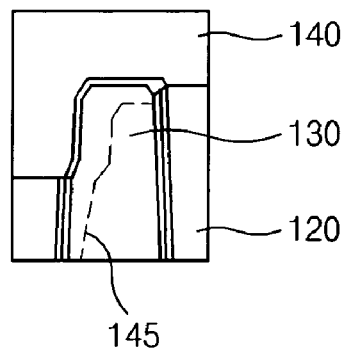

FIG. 10 is an enlarged view of VI in FIG. 9.

Referring to FIG. 10, a depletion layer region 145 is depicted with a broken line in the active region under the gate structure. Here, the depletion layer region 145 is introduced due to the gate insulating film 130. In accordance with an embodiment of the present invention, the depletion layer region 145 can obtain a sufficient margin as compared to a fin-type gate exposing both sidewalls of the protruded active region to secure enough current in the depletion layer region, thereby satisfying threshold voltage regulated for the transistor.

In another embodiment of the present invention, the line width of the gate structure formed on the recess gate region can be larger than that of the gate structure formed on the device isolation film. At this time, the ratio of the line width of the gate structure formed on the recess gate region and that of the other preferably ranges from 1.1 to 1.8.

As described above, according to the present invention, a sufficient channel region can be secured so as to increase drive current. The method of forming a transistor for a semiconductor device according to the present invention can be employed in fabricating a transistor for a semiconductor device due to satisfying threshold voltage regulated for the transistor. Also, it can be applied to a conventional method of forming a transistor for a semiconductor device, whereby a high integration of a semiconductor device is fabricated without further investment. Since the present invention improves the characteristics and reliability of a semiconductor device, it provides an effect facilitating high integration of a semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A transistor for a semiconductor device comprising:
a semiconductor substrate comprising a first active region, a second active region, a third active region, and a device isolation film, wherein the first active region, the second active region and the third active region are disposed in the semiconductor substrate in parallel;
a first gate region disposed on the device isolation film, wherein the first gate region intersects the first active region and the second active region;
a first recess gate region formed in the device isolation film in the first gate region, wherein the first recess gate region exposes a first sidewall of the first active region and a sidewall of the second active region, the first sidewall of the first active region facing the sidewall of the second active region;
a second gate region disposed on the device isolation film, wherein the second gate region intersects the first active region and the third active region;
a second recess gate region formed in the device isolation film in the second gate region, wherein:
the second recess gate region exposes a second sidewall of the first active region and a sidewall of the third active region,
the second sidewall of the first active region faces the sidewall of the third active region, and
the first recess gate region and the second gate region are alternately disposed in the device isolation film in parallel such that that the first recess gate region does not overlap the second recess gate region in a longitudinal direction of the first active region;
a gate insulating film disposed on a surface of each active region and the sidewall of each active region exposed by the first and second recess gate regions; and
a gate structure disposed on the gate insulating film of each active region and the device isolation film of each gate region.

2. The transistor according to claim 1, wherein a line width of the gate structure is substantially equal to a line width of each recess gate region.

3. The transistor according to claim 2, wherein the line width of the gate structure on each recess gate region is greater than the line width of the gate structure on the device isolation film.

4. The transistor according to claim 3, wherein a ratio of the line width of the gate structure on each recess gate region to the line width of the gate structure on the device isolation film ranges from 1:1.1 to 1:1.8.

5. A method of forming a transistor for a semiconductor device, the method comprising the steps of:
forming a device isolation film defining a first active region, a second active region and a third active region in a semiconductor substrate, wherein the first active region, the second active region and the third active region are disposed in the semiconductor substrate in parallel;
defining a first gate region on the device isolation film, wherein the first gate region intersects the first active region and the second active region;
recessing a predetermined portion in the first gate region to form a first recess gate region by etching the device isolation film, wherein the first recess gate region exposes a first sidewall of the first active region and a sidewall of the second active region, the first sidewall of the first active region facing the sidewall of the second active region;

defining a second gate region on the device isolation film, wherein the second gate region intersects the first active region and the third active region;

recessing a predetermined portion in the second gate region to form a second recess gate region by etching the device isolation film, wherein:

the second recess gate region exposes a second sidewall of the first active region and a sidewall of the third active region, the second sidewall of the first active region faces the sidewall of the third active region, and the first recess gate region and the second gate region are alternately disposed in the device isolation film in parallel such that that the first recess gate region does not overlap the second recess gate region in a longitudinal direction of the first active region;

forming a gate insulating film on a surface of each active region and the sidewall of each active region exposed by the first and second recess gate regions; and forming a gate structure on the gate insulating film of each active region and the device isolation film of each gate region.

6. The method according to claim 5, wherein a thickness of the device isolation film ranges from 150 to 1000 nm.

7. The method according to claim 5, wherein a line width of the gate structure is substantially equal to a line width of each recess gate region.

8. The method according to claim 7, wherein the line width of the gate structure on each recess gate region is greater than the line width of the gate structure on the device isolation film.

9. The method according to claim 8, wherein a ratio of the line width of the gate structure on each recess gate region to the line width of the gate structure on the device isolation film ranges from 1:1.1 to 1:1.8.

10. The method according to claim 5, wherein the device isolation film is etched to have a thickness that ranges from 50 to 500 nm.

11. The method according to claim 5, wherein recessing the predetermined portions in the first gate region and the second gate region is performed using a mixture gas of (i) at least one of a fluorine-base gas and a chlorine-base gas and (ii) $O_2$ gas in the ratio of ranging from 1-10:1, wherein the fluorine-base gas is selected from the group consisting of $CF_4$, $CHF_3$, $C_3F_8$, $NF_3$, and combinations thereof and the chlorine-base gas is selected from the group consisting of $Cl_2$, $Cl_4$, and a combination thereof.

12. The method according to claim 5, wherein the gate insulating film forming process comprises a dry oxidation method using an oxygen gas at a temperature ranging from 500 to 1100° C.

13. The method according to claim 5, wherein the gate insulating film forming process comprises a wet oxidation method using a mixture gas of $O_2/H_2$.

14. The method according to claim 5, wherein the gate insulating film forming process comprises a plasma oxidation method using a gas selected from the group consisting of $O_2$, $N_2$, He, $H_2$, $N_2O$ and combinations thereof.

15. The method according to claim 5, wherein the gate insulating film is selected from the group consisting of silicon oxide film, hafnium oxide film, aluminum, oxide film, zirconium oxide film, silicon nitride film and combinations thereof.

16. The method according to claim 5, wherein a thickness of the gate insulating film ranges from 1 to 10 nm.

17. The method according to claim 5, wherein the gate structure comprises a polysilicon layer formed by a polysilicon CVD method accompanied with a doping process using P or B.

18. The method according to claim 5, further comprising a step of cleaning the surface of each active region by using a solution including HF.

\* \* \* \* \*